United States Patent
Nakagawa et al.

(10) Patent No.: US 7,755,065 B2
(45) Date of Patent: Jul. 13, 2010

(54) FOCUSED ION BEAM APPARATUS

(75) Inventors: Yoshitomo Nakagawa, Chiba (JP); Kenichi Nishinaka, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 231 days.

(21) Appl. No.: 12/046,987

(22) Filed: Mar. 12, 2008

(65) Prior Publication Data

US 2008/0308741 A1 Dec. 18, 2008

(30) Foreign Application Priority Data

Mar. 16, 2007 (JP) ............... 2007-069336

(51) Int. Cl.
*H01J 37/08* (2006.01)
(52) U.S. Cl. ............... 250/492.21; 250/492.1; 250/492.2; 250/492.22; 250/423 R; 250/424; 427/569; 118/723 R; 118/723 I; 216/67
(58) Field of Classification Search ............... 250/492.1, 250/492.2, 492.22, 492.3, 423 R, 424; 427/569; 118/723 R, 723 I; 216/67
See application file for complete search history.

(56) References Cited

U.S. PATENT DOCUMENTS

| | | | |
|---|---|---|---|
| 5,108,535 A * | 4/1992 | Ono et al. ............... | 156/345.35 |
| 5,583,344 A * | 12/1996 | Mizumura et al. ..... | 250/492.21 |
| 5,821,548 A * | 10/1998 | Hinchliffe ............... | 250/492.21 |
| 6,624,584 B2 * | 9/2003 | Schmidt-Boecking et al. ... | 315/111.81 |
| 2005/0183667 A1 * | 8/2005 | Keller et al. ............... | 118/723 I |
| 2006/0157198 A1 * | 7/2006 | Furuse et al. ........... | 156/345.24 |
| 2008/0156998 A1 * | 7/2008 | Sugiyama ............... | 250/396 R |

FOREIGN PATENT DOCUMENTS

| JP | 3564717 B | 6/2004 |
|---|---|---|
| JP | 2006-66398 A | 3/2006 |

* cited by examiner

*Primary Examiner*—Robert Kim
*Assistant Examiner*—Michael Maskell
(74) *Attorney, Agent, or Firm*—Brinks Hofer Gilson & Lione

(57) ABSTRACT

A focused ion beam apparatus includes a plasma generator having a plasma torch therein, which lets plasma flow out while being kept inside, a differential exhaust chamber that is connected to the plasma torch via the torch orifice to cause adiabatic expansion of the plasma flowing out of the plasma torch to form a supersonic flow of the plasma, a drawing orifice provided at the differential exhaust chamber at a position facing the torch orifice to draw ions from the supersonic flow of the plasma, a drawing electrode that electrostatically accelerates ions having passed through the drawing orifice to further draw ions, and an ion optical system that focuses the ions drawn from the drawing electrode and causing the ions to enter the sample by optically manipulating the ions.

10 Claims, 2 Drawing Sheets

FOCUSED ION BEAM APPARATUS

RELATED APPLICATIONS

This application claims priority under 35 U.S.C. §119 to Japanese Patent Application No. JP2007-069336 filed Mar. 16, 2007, the entire content of which is hereby incorporated by reference.

BACKGROUND OF THE INVENTION

The present invention relates to a focused ion beam apparatus.

A focused ion beam apparatus is used in a variety of applications, such as micropatterning, observation and analysis of semiconductor devices or the like, correcting defects of photomasks, preparation of TEM samples. A liquid metal ion source is widely used as an ion source in the focused ion beam apparatus, and gallium is generally used as an ion element.

With the use of the focused ion beam apparatus using a gallium liquid metal ion source, metal ions irradiated on a work surface of a sample to be worked remain as an impurity with respect to the sample after the metal ions finish the initial purpose, adversely affecting the sample. For example, a semiconductor device polluted with gallium causes an increase in leak current and suffers a shorter life, and a photomask polluted with gallium reduces the light transmittance.

As a solution to the problem, JP-A-2006-66398 proposes an ion source that does not affect a sample to be worked and includes a plasma chamber having an opening from which a plasma jet is extracted, and a reaction gas chamber provided in conjunction with the plasma chamber and having an opening for receiving a part of the plasma jet and an opening for extracting an active reaction gas.

Japanese Patent No. 3564717 proposes an ion source which draws ions by using the curvature of the equipotential surface of an ion sheath produced near the ion drawing opening.

The ion source described in JP-A-2006-66398 has the problem that the ion beam irradiated on a sample has energy spread due to the plasma potential generated and the beam size cannot be narrowed to disable observation or processing of micropatterns, as compared with an ion source using a liquid metal of gallium.

It is desirable that the current for generating an ion beam generated by a focused ion beam apparatus be set in a wide range of, for example, 10 pA or less to 10 nA or above and the ion beam be made narrower. The ion source therefore needs to draw ions with a high current density from a small area. However, the ion source described in Patent Document 2 suffers a somewhat limited range of the ion drawing current for the ion source is of a type which basically draws ions from the ion drawing opening whose radius is smaller than the thickness of the ion sheath of the plasma by using the curvature of the equipotential surface of the ion sheath. In addition, with a high current applied, it is difficult to narrow the beam size.

The present invention has been made in view of the foregoing situations, and it is an object of the invention to provide a focused ion beam apparatus which can make the beam size narrower and set the ion beam current variable in a wide range.

SUMMARY OF THE INVENTION

According to the present invention, there is provided a focused ion beam apparatus for irradiating an ion beam having a beam size narrowed to or below a predetermined value on a sample, observing or analyzing a top surface of the sample or processing the top surface of the sample, comprising a plasma generator having a plasma torch therein, which lets plasma flow out while being kept inside; a differential exhaust chamber that is connected to the plasma torch to cause adiabatic expansion of the plasma flowing out of the plasma torch to form a supersonic flow of the plasma; a drawing orifice provided at the differential exhaust chamber at a position facing the plasma torch to draw ions from the supersonic flow of the plasma; a drawing electrode that electrostatically accelerates ions having passed through the drawing orifice to further draw ions; and an ion optical system that focuses the ions drawn from the drawing electrode and causing the ions to enter the sample by optically manipulating the ions.

The focused ion beam apparatus of the present invention acquires ions from plasma by a system quite different from the techniques described in the aforementioned publications. The focused ion beam apparatus employs a system of acquiring ions from a supersonic flow of plasma formed in the differential exhaust chamber. Accordingly, the focused ion beam apparatus does not suffer the restriction of the technique described in Patent Document 2 such that ions are drawn from the ion drawing opening whose radius is smaller than the thickness of the ion sheath of plasma, and can draw ions with a high current density from a small area.

In addition, the adiabatic expansion of plasma caused in the supersonic flow can lower the temperature of ions. With the ion temperature being low, the vector of the momentum in the vertical direction with respect to the direction of flow is small, i.e., the component that cause beam spreading is small, allowing ions in a uniform flow to be drawn. This facilitates the formation of a focused ion beam with a small beam size.

It is desirable that in the focused ion beam apparatus of the present invention, the plasma generator generate an inductively coupled plasma, and include a work coil that is wound around the plasma torch to generate a high-frequency magnetic field; a high-frequency power supply that supplies high-frequency power to the work coil; and a plasma gas feeding unit that feeds a gas to be plasma to the plasma torch.

This configuration allows ions to be effectively drawn from a high-temperature, high-density inductively coupled plasma generated by the plasma generator.

It is desirable that in the focused ion beam apparatus of the present invention, the plasma torch and the differential exhaust chamber be connected together blocked against air, and an interior of the differential exhaust chamber be evacuated by a vacuum pump.

Accordingly, pure plasma can be generated while preventing permeation of air. The pressure in the plasma torch can be set equal to or higher than the atmospheric pressure, thereby allowing plasma with higher density to be generated. Further, increasing the internal pressure of the plasma torch can set the pressure difference between the plasma torch and the differential exhaust chamber larger. This allows ions to be drawn under the condition of a faster supersonic flow with a higher density.

It is preferable that in the focused ion beam apparatus of the present invention, the drawing orifice be formed in a hollow conic shape protruding inside the differential exhaust chamber, and have an opening provided at a top of the drawing orifice formed in a hollow conic shape to draw the ions, and the drawing electrode be disposed inside the drawing orifice formed in the hollow conic shape. It is preferable that an angle of the vertex of the drawing orifice be set in a range of 70 degrees to 90 degrees.

In this case, as the drawing orifice is formed in the hollow conic shape protruding inside the differential exhaust chamber, the supersonic flow of plasma flowing out of the plasma torch is not disturbed. Particularly, setting the angle of the vertex of the drawing orifice set in a range of 70 degrees to 90 degrees minimizes the disturbance of the supersonic flow.

Because an opening for drawing the ions is provided at the vertex of the drawing orifice formed in the hollow conic shape, fast ions with high linearity present at the center can be drawn out. As the drawing electrode is disposed inside the drawing orifice formed in the hollow conic shape, the distance between the drawing orifice and the drawing electrode can be made shorter, so that ions to be drawn from the opening of the drawing orifice can be further accelerated by the drawing electrode while maintaining the high speed.

It is desirable that in the focused ion beam apparatus of the present invention, the torch orifice be disposed between the plasma torch and the differential exhaust chamber, and a diameter of the torch orifice be set equal to or greater than twice a thickness of an ion sheath produced by the plasma generator.

In this case, as the outlet of the plasma torch is made narrower by the torch orifice, the internal pressure of the plasma torch is increased, thereby speeding up the supersonic flow to be produced. Setting the diameter of the torch orifice equal to or greater than twice the thickness of an ion sheath allows plasma to flow out to the differential exhaust chamber. As a consequence, a supersonic flow of plasma can be extracted from the torch orifice.

It is preferable that in the focused ion beam apparatus of the present invention, the torch orifice be formed of alumina, magnesium oxide or calcium oxide.

In this case, when the torch orifice is formed of a high-melting point insulator, such as alumina, electrons do not escape from plasma through the torch orifice, thus preventing generation of the plasma potential. This can suppress energy spreading, make it easier to narrow a focused ion beam and make it difficult to cause discharge.

According to the present invention, a supersonic flow of plasma is formed in the differential exhaust chamber and ions are drawn from the supersonic flow, so that ions with a high current density can be drawn from a small area. In addition, as adiabatic expansion of plasma occurs in the supersonic flow, the temperature of ions can be lowered, thus allowing ions having small beam spreading in a uniform flow to be drawn.

As a result, the beam size can be made narrower and the ion beam can be drawn over a wider current range.

DETAILED DESCRIPTION OF THE PREFERRED EMBODIMENTS

A preferred embodiment of a focused ion beam apparatus according to the present invention will be described below with reference to the accompanying drawings.

Figure 1:
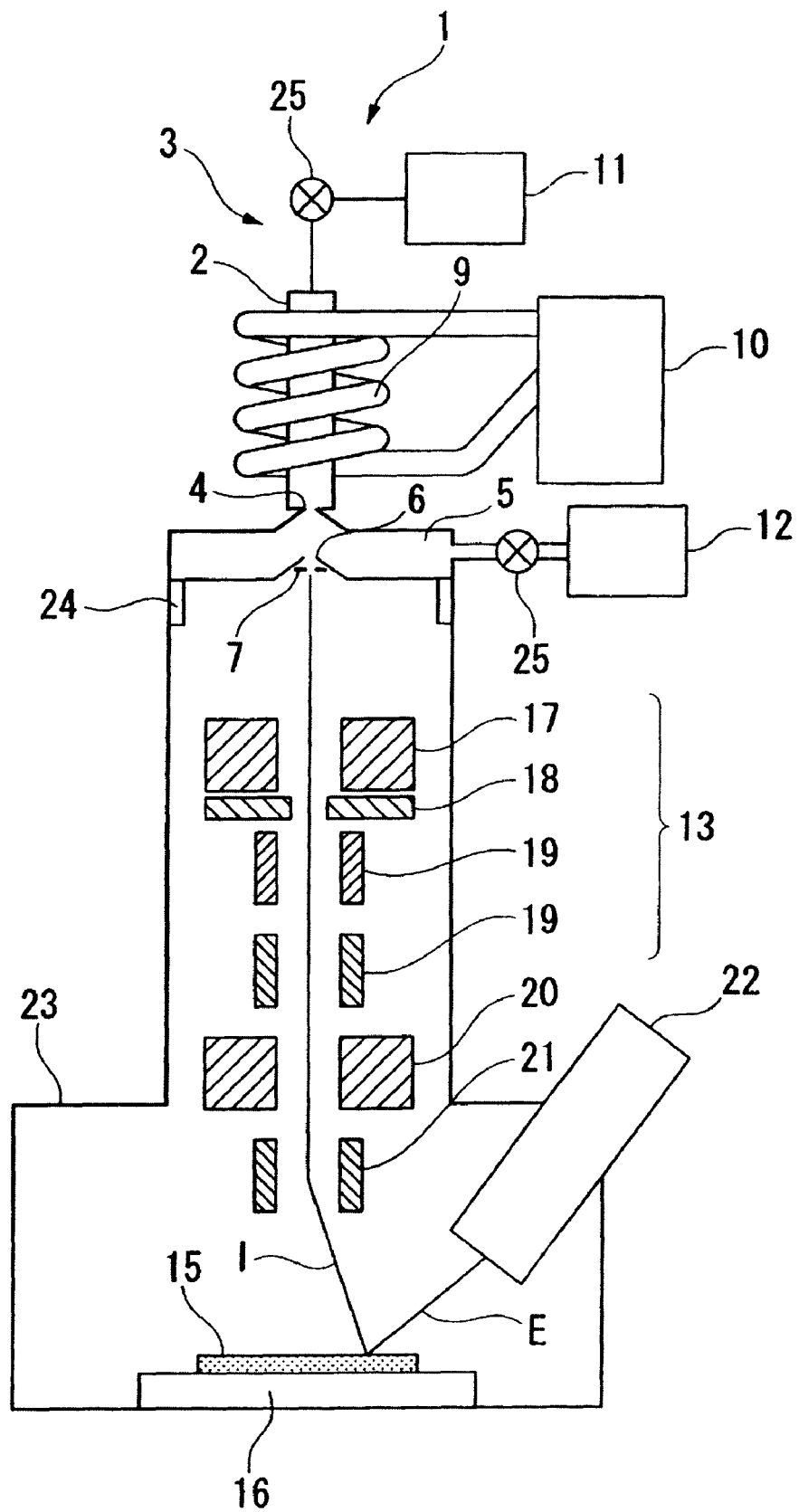
FIG. 1 is a schematic diagram showing the general configuration of an embodiment of a focused ion beam apparatus according to the present invention.
Figure 2:
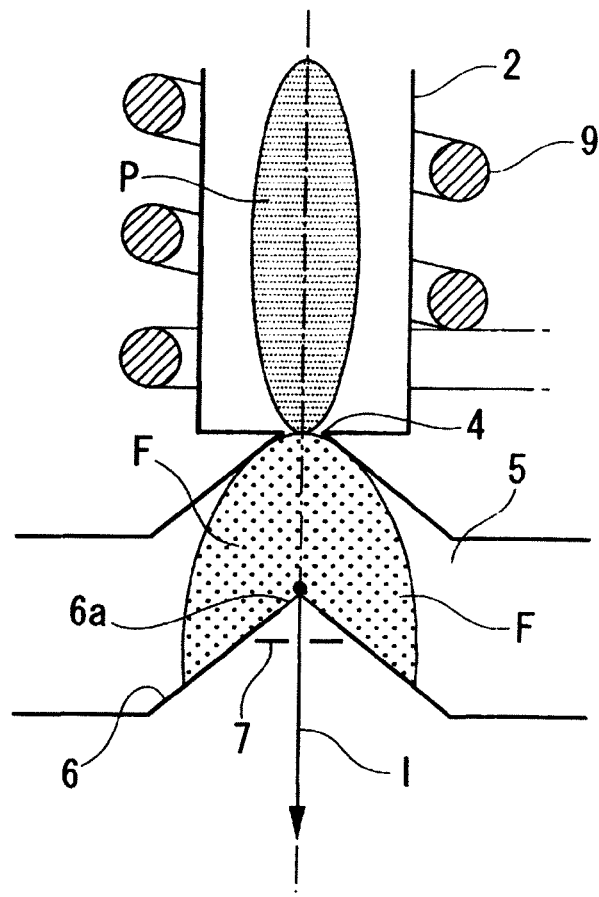
FIG. 2 is a cross-sectional view showing the details of the essential portions of an ion source.
Figure 3:
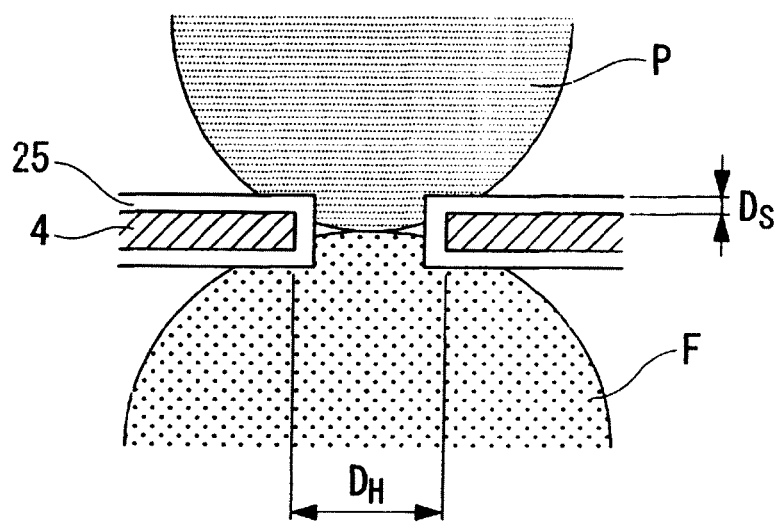
FIG. 3 is a cross-sectional view showing the details of an opening of a torch orifice.

FIGS. 1 to 3 illustrate an embodiment of a focused ion beam apparatus. FIG. 1 is a diagram showing of the schematic general configuration of the apparatus, FIG. 2 is a cross-sectional view showing the details of the essential portions of an ion source, and FIG. 3 is a cross-sectional view showing the details of an opening of a torch orifice.

In FIG. 1, reference numeral 1 denotes a plasma ion source.

The plasma ion source 1 includes a plasma generator 3 having a plasma torch 2 therein, which lets plasma flow out while being kept inside, a differential exhaust chamber 5 that is provided below the plasma torch 2 and connected to the plasma torch 2 via a torch orifice 4, provided at a lower end of the plasma torch 2, to cause adiabatic expansion of the plasma flowing out of the torch orifice 4 to form a supersonic flow of the plasma, a drawing orifice 6 provided at a lower surface portion of the differential exhaust chamber 5 at a position facing the torch orifice 4 to draws ions from the supersonic flow of the plasma, and a drawing electrode 7 that electrostatically accelerates ions having passed through the drawing orifice 6 to further draw ions.

The plasma generator 3 generates an inductively coupled plasma. The plasma generator 3 has the plasma torch 2, a work coil 9 wound therearound to surround the plasma torch 2 to generate a high-frequency magnetic field, a high-frequency power supply 10 which supplies high-frequency power to the work coil 9, and a plasma gas feeding unit 11 which feeds a gas to be plasma, such as argon gas, xenon gas or oxygen gas, to the plasma torch 2.

A quartz tube with an inside diameter of about 1 mm is used as the plasma torch 2. The torch orifice 4 is formed by a high-melting point insulating material, such as alumina, magnesium oxide or calcium oxide.

The differential exhaust chamber 5 is evacuated by a vacuum pump 12 so that the interior is kept at a predetermined vacuum pressure. The torch orifice 4 which connects the differential exhaust chamber 5 with the plasma torch 2 is blocked against air, so that the interiors of the differential exhaust chamber 5 and the plasma torch 2 are isolated from the air.

Ions drawn from the drawing electrode 7 are emitted in the form of a beam, and are ion-optically manipulated by an ion optical sysmte 13 to become a focused ion beam I which is irradiated on a sample 15. The sample 15 is placed on the top portion of a moving stage 16, and is moved and adjusted in X and Y directions orthogonal to each other by the moving stage 16.

The ion optical system 13 has a condenser lens 17, a diaphragm 18, an aligner 19, an objective lens 20 and a deflector 21 disposed in order from the side where the drawing orifice 6 is located toward the sample 15.

The condenser lens 17 serves to focus the ion beam I drawn from the drawing electrode 7, and has, for example, an Einzel lens which normally has three electrodes. The diaphragm 18 makes the ion beam I passing therethrough narrower. The aligner 19 has a plurality of electrodes arranged approximately cylindrically, for example, in two stages. As voltages are independently applied to the respective electrodes, the deviation of the optical axis of the passing ion beam I is corrected.

The objective lens 20 serves to eventually focus the ion beam I irradiated from above onto the sample 15. Like the condenser lens 17, the objective lens 20 has an Einzel lens which comprises three electrodes. The deflector 21 applies a voltage to each of electrodes obtained by quadrant segments of a cylinder, and bends the orbit of the ion beam I by an electric field generated by the voltage application to freely shift the beam irradiation position on the sample 15 in the X and Y directions orthogonal to each other.

When an ion beam is irradiated on the sample 15, the sample 15 discharges secondary electrons E. As the discharged secondary electrons E are detected by a secondary electrons detector 22, the top surface of the sample 15 can be observed.

The sample 15 and the moving stage 16 are accommodated in a vacuum chamber 23 which can be depressurized to a predetermined degree of vacuum. An insulating material 24 is disposed between the differential exhaust chamber 5 and the vacuum chamber 23 to electrically insulate both chambers. A potential difference of 5 kV to 50 kV or so is applied between the plasma ion source 1 and the sample 15. The potential difference accelerates the ion beam I and relatively reduces the influence of the energy spreading of the ion source, so that the ion beam I can be made narrower.

Reference numeral 25 denotes a valve.

As shown in FIG. 2, the drawing orifice 6 is formed in a hollow conic shape whose vertex has an angle set to about 70 degrees to 90 degrees and which protrudes inside the differential exhaust chamber 5. An opening 6a for drawing out ions is formed at the top of the drawing orifice 6 formed in the hollow conic shape. The diameter of the opening 6a is set to, for example, 0.1 mm or less.

The torch orifice 4, the drawing orifice 6 and the drawing electrode 7 are all arranged coaxially.

As shown in FIG. 3, a plasma sheath 25 is generated between plasma P and the torch orifice 4. Given that the thickness of the plasma sheath 25 is $D_S$ and the diameter of the torch orifice 4 is $D_H$, $D_H$ is set to a value equal to or greater than twice $D_S$. This setting will be specifically described later.

The operation of the focused ion beam apparatus with the foregoing configuration will be explained next.

In the plasma generator 3, as power of 10 W to 200 W or so is supplied to the work coil 9 at a frequency of 100 MHz from the high-frequency power supply 10, high-temperature, high-density plasma P is generated. In this case, the electron temperature is about 4000 K to 10000 K, and the electron density is about $10^{15}$ electrons/cm$^3$ to $10^{16}$ electrons/cm$^3$. With the inductively coupled plasma, plasma is maintained as electrons or ions vibrate or collide to be ionized in a high-frequency magnetic field generated by the work coil 9. The plasma feeding unit 11 feeds a plasma gas, e.g., argon gas, xenon gas or the like, at a rate of 0.05 l/min to 2 l/min or so.

The internal pressure of the plasma torch 2 is set equal to or higher than the atmospheric pressure, and the internal pressure of the differential exhaust chamber 5 is lowered to 100 Pa to 2000 Pa or so by the vacuum pump 12. The pressure difference allows the plasma P generated in the plasma torch 2 to form a supersonic flow F of the plasma through adiabatic expansion in the differential exhaust chamber 5.

The formation of the plasma supersonic flow F through the torch orifice 4 needs to meet the following two conditions.

As shown in FIG. 3, one condition is that the diameter $D_H$ of the torch orifice 4 is set equal to or greater than twice the thickness $D_S$ of the ion sheath 25. In other words, the thickness $D_S$ of the ion sheath 25 becomes equal to or smaller than ½ of the inside diameter (diameter) $D_H$ of the torch orifice 4. With $D_H/2<D_S$, the torch orifice 4 is blocked by the ion sheath 25, so that the plasma P cannot pass through the torch orifice 4. Then, the phase of the supersonic flow is no longer the plasma phase. The other condition is that the generated plasma P passes through the torch orifice 4 as a continuous flow. The "continuous flow" is the state where gas molecules collide multiple times at the time of passing the torch orifice 4. Given that the mean free path of the plasma gas is λ, the Knudsen number Kn that is an index characterizing the gas flow is given by $$Kn=\lambda/D_H.$$

The condition for the continuous flow is to fulfill Kn<0.01. Satisfying the condition for the continuous flow, ions or neutral particles are accelerated to form a supersonic flow of Mach 5 to 20 or so in the process where plasma adiabatically expands.

The torch orifice 4 is formed of a high-melting point insulator, such as alumina, magnesium oxide or calcium oxide. Therefore, electrons do not escape from the plasma P through the torch orifice 4, thus preventing the generation of the plasma potential. This can suppress energy spreading and makes it harder to cause discharge.

In the embodiment, the plasma torch 2 and the differential exhaust chamber 5 are connected together blocked against air. What is more, the interior of the differential exhaust chamber 5 is evacuated by the vacuum pump 12. This makes possible to generate air-free pure plasma in the plasma torch 2. The internal pressure of the plasma torch 2 can be set equal to or higher than the atmospheric pressure, so that plasma with higher density can be generated. Further, increasing the pressure in the plasma torch 2 can set the pressure difference between the plasma torch 2 and the differential exhaust chamber 5 greater. Accordingly, ions can be drawn under higher density and higher speed conditions.

In the supersonic flow, the ion temperature becomes significantly lower than the temperature in the plasma torch 2 due to the adiabatic expansion. Note that the electron temperature does not change much from the temperature of electrons in the plasma torch 2. This state is preferable for the ion source of the focused ion beam apparatus. This is because a low ion temperature means that the component which cause beam spreading is small and it is easy to narrow the ion beam, and a high electron temperature (or no dropping of the electron temperature) means that the ionization is maintained and the ion source is a "bright ion source".

The drawing orifice 6 is positioned in the extracted supersonic flow F of plasma. The drawing orifice 6 is formed in a hollow conic shape whose vertex has an angle of 70 degrees to 90 degrees, thereby preventing the disturbance of the supersonic flow. If the supersonic flow is disturbed, a high temperature and high density state called "barrel shock" is made, so that the components of the drawing orifice 6 are mixed into the ion beam, polluting the ion beam or the ion temperature rises, making it harder to narrow the ion beam, or the life of the drawing orifice 6 becomes shorter.

As the opening 6a for drawing ions is provided at the top of the drawing orifice 6 formed in a hollow conic shape in the embodiment, fast ions with high linearity present at the center can be drawn out. As the drawing electrode 7 is disposed inside the drawing orifice 6 formed in the hollow conic shape, the distance between the drawing orifice 6 and the drawing electrode 7 can be shortened. The voltage applied by the drawing electrode 7 is −100 V to −300 V or so with respect to the drawing orifice 6. Accordingly, ions which have passed the opening 6a of the drawing orifice 6 can be drawn by the electric field produced by the drawing electrode 7 before the size of the ion beam becomes larger due to the spatial charge effect (such that the charges of ions cause the ions to repel one another).

The ion beam I drawn from the drawing electrode 7 is then accelerated to predetermined energy of 5 keV to 50 keV or so by the ion optical system 13. At this time, the ion beam current can be changed by adjusting the diameter of the diaphragm 18 in the ion optical system 13.

As apparent from the above, the focused ion beam apparatus according to the present invention can change the ion beam current within a wide range of 10 pA or lower to 10 nA or higher while narrowing the beam size to 0.1 μm or less.

The technical scope of the present invention is not limited to the above-described embodiment, and various changes and modifications can be made without departing from the spirit or scope of the invention.

For example, the plasma generator 3 in the embodiment generates inductively coupled plasma as one example, which is not restrictive, and the present invention can be adapted to a case where plasma is generated by another system, such as microwave induced plasma.

Although the focused ion beam apparatus has just a lens tube to irradiate a focused ion beam I in the embodiment, the present invention is not limited to this example, but is adaptable to a complex focused ion beam apparatus which has an electron beam tube or gas ion beam tube in addition to the tube which generates a focused ion beam.

What is claimed is:

1. A focused ion beam apparatus for irradiating an ion beam having a beam size narrowed to or below a predetermined value on a sample, observing or analyzing a top surface of the sample or processing the top surface of the sample, comprising:
    a plasma generator having a plasma torch which lets plasma flow out while maintaining plasma inside, wherein the plasma generator generates an inductively coupled plasma, and includes:
        a work coil that is wound around the plasma torch to generate a high-frequency magnetic field;
        a high-frequency power supply that supplies high-frequency power to the work coil; and
        a plasma gas feeding unit that feeds a gas to become plasma to the plasma torch;
    a differential exhaust chamber that is coupled with the plasma torch to cause adiabatic expansion of the plasma flowing out of the plasma torch to form a supersonic flow of the plasma;
    a torch orifice disposed between the plasma torch and the differential exhaust chamber, wherein the torch orifice comprises a diameter set equal to or greater than twice a thickness of an ion sheath produced by the plasma generator;
    a drawing orifice provided at the differential exhaust chamber and faced to the plasma torch to draw ions from the supersonic flow of the plasma;
    a drawing electrode that electrostatically accelerates ions having passed through the drawing orifice; and
    an ion optical system that irradiates and focuses the ions drawn from the drawing electrode on the sample by optically manipulating the ions.

2. The focused ion beam apparatus according to claim 1, wherein the plasma torch and the differential exhaust chamber are coupled together blocked against air, and
    an interior of the differential exhaust chamber is evacuated by a vacuum pump.

3. The focused ion beam apparatus according to claim 1, wherein the drawing orifice is formed in a hollow conic shape protruding inside the differential exhaust chamber, and has an opening provided at a top of the drawing orifice formed in a hollow conic shape to draw the ions, and the drawing electrode is disposed inside the drawing orifice.

4. The focused ion beam apparatus according to claim 1, wherein the torch orifice is formed of alumina, magnesium oxide or calcium oxide.

5. The focused ion beam apparatus according to claim 3, wherein an angle of the vertex of the drawing orifice is set in a range of 70 degrees to 90 degrees.

6. A focused ion beam apparatus for irradiating an ion beam having a beam size narrowed to or below a predetermined value on a sample, observing or analyzing a top surface of the sample or processing the top surface of the sample, comprising:
    a plasma generator having a plasma torch which lets plasma flow out while maintaining plasma inside;
    a differential exhaust chamber that is coupled with the plasma torch to cause adiabatic expansion of the plasma flowing out of the plasma torch to form a supersonic flow of the plasma;
    a drawing orifice provided at the differential exhaust chamber and faced to the plasma torch to draw ions from the supersonic flow of the plasma, wherein the drawing orifice is formed in a hollow conic shape that protrudes inside the differential exhaust chamber and comprises a vertex whose angle is set in a range of 70 degrees to 90 degrees, the drawing orifice comprising an opening provided at a top of the drawing orifice formed in the hollow conic shape to draw the ions;
    a drawing electrode that electrostatically accelerates ions having passed through the drawing orifice, wherein the drawing electrode is disposed inside the drawing orifice; and
    an ion optical system that irradiates and focuses the ions drawn from the drawing electrode on the sample by optically manipulating the ions.

7. The focused ion beam apparatus according to claim 6, wherein the plasma generator generates an inductively coupled plasma, and includes:
    a work coil that is wound around the plasma torch to generate a high-frequency magnetic field;
    a high-frequency power supply that supplies high-frequency power to the work coil; and
    a plasma gas feeding unit that feeds a gas to become plasma to the plasma torch.

8. The focused ion beam apparatus according to claim 7, wherein the plasma torch and the differential exhaust chamber are coupled together blocked against air, and
    an interior of the differential exhaust chamber is evacuated by a vacuum pump.

9. The focused ion beam apparatus according to claim 7, further comprising a torch orifice disposed between the plasma torch and the differential exhaust chamber, wherein the torch orifice comprises a diameter set equal to or greater than twice a thickness of an ion sheath produced by the plasma generator.

10. The focused ion beam apparatus according to claim 9, wherein the torch orifice is formed of alumina, magnesium oxide or calcium oxide.

* * * * *